US012723301B2

(12) United States Patent
Carpenter

(10) Patent No.: US 12,723,301 B2
(45) Date of Patent: Sep. 1, 2026

(54) PVD DEPOSITED TERNARY AND QUATERNARY NITI ALLOYS AND METHODS OF MAKING SAME

(71) Applicant: Vactronix Scientific, LLC, San Antonio, TX (US)

(72) Inventor: Scott P. Carpenter, Freemont, CA (US)

(73) Assignee: Vactronix Scientific, LLC, San Antonio, TX (US)

( * ) Notice: Subject to any disclaimer, the term of this patent is extended or adjusted under 35 U.S.C. 154(b) by 42 days.

(21) Appl. No.: 18/887,528

(22) Filed: Sep. 17, 2024

(65) Prior Publication Data

US 2025/0084523 A1 Mar. 13, 2025

Related U.S. Application Data

(63) Continuation of application No. 17/751,245, filed on May 23, 2022, now Pat. No. 12,091,742.

(60) Provisional application No. 63/192,539, filed on May 24, 2021.

(51) Int. Cl.
*B32B 15/01* (2006.01)
*C22C 19/03* (2006.01)
*C23C 14/16* (2006.01)
*C23C 14/35* (2006.01)

(52) U.S. Cl.
CPC ............ *C23C 14/165* (2013.01); *B32B 15/01* (2013.01); *C23C 14/352* (2013.01)

(58) Field of Classification Search
CPC ................................ B32B 15/01; C22C 19/03
See application file for complete search history.

(56) References Cited

U.S. PATENT DOCUMENTS 6,454,913 B1 9/2002 Rasmussen et al.
6,592,724 B1 7/2003 Rasmussen et al.
2003/0059640 A1 3/2003 Marton et al.
2006/0038643 A1 2/2006 Xu et al.
2006/0289295 A1 12/2006 Jardine
2008/0077228 A1 3/2008 Goto

FOREIGN PATENT DOCUMENTS

CN 108611611 A 10/2018
GB 2266897 B 11/1993
JP 2002254397 A 9/2002
WO WO-2016084087 A2 * 6/2016 ............. A61L 31/14

OTHER PUBLICATIONS

Yang et al., Structure analysis of a precipitate phase in an Ni-rich high-temperature NiTiHf shape memory alloy, Acta Materialia 61 ( 2013) 3335-3346. (Year: 2013).*

International Searching Authority; Notification of Transmittal of the International Search Report and the Written Opinion of the International Searching Authority, or the Declaration. International Application No. PCT/US2022/030713; Dated: Sep. 29, 2022.

International Searching Authority; Written Opinion of the International Searching Authority. International Application No. PCT/US2022/030713; Dated: Sep. 29, 2022.

* cited by examiner

*Primary Examiner* — Adam Krupicka
(74) *Attorney, Agent, or Firm* — Rosenbaum IP, P.C.; David G. Rosenbaum

(57) ABSTRACT

Ternary and quaternary shape memory alloys, particularly nickel-titanium based quaternary and quaternary shape memory alloys, are disclosed and made by a method employing physical vapor deposition (PVD), such as by sputtering, of NiTiX, wherein X is a ternary metal constituent. By employing PVD processing, ternary and quaternary NiTi alloy bulk materials may be made in in the as-deposited state such that the configuration and conformation of a desired precursor material, e.g., wires, tubes, planar materials, curvilinear, or as the near finished end product, such as a hypotube for stent manufacture, semilunar for cardiac valves or conical for embolic or caval filters, is formed on a removable deposition substrate in the configuration and conformation of the precursor material or near-finished end product.

29 Claims, 1 Drawing Sheet

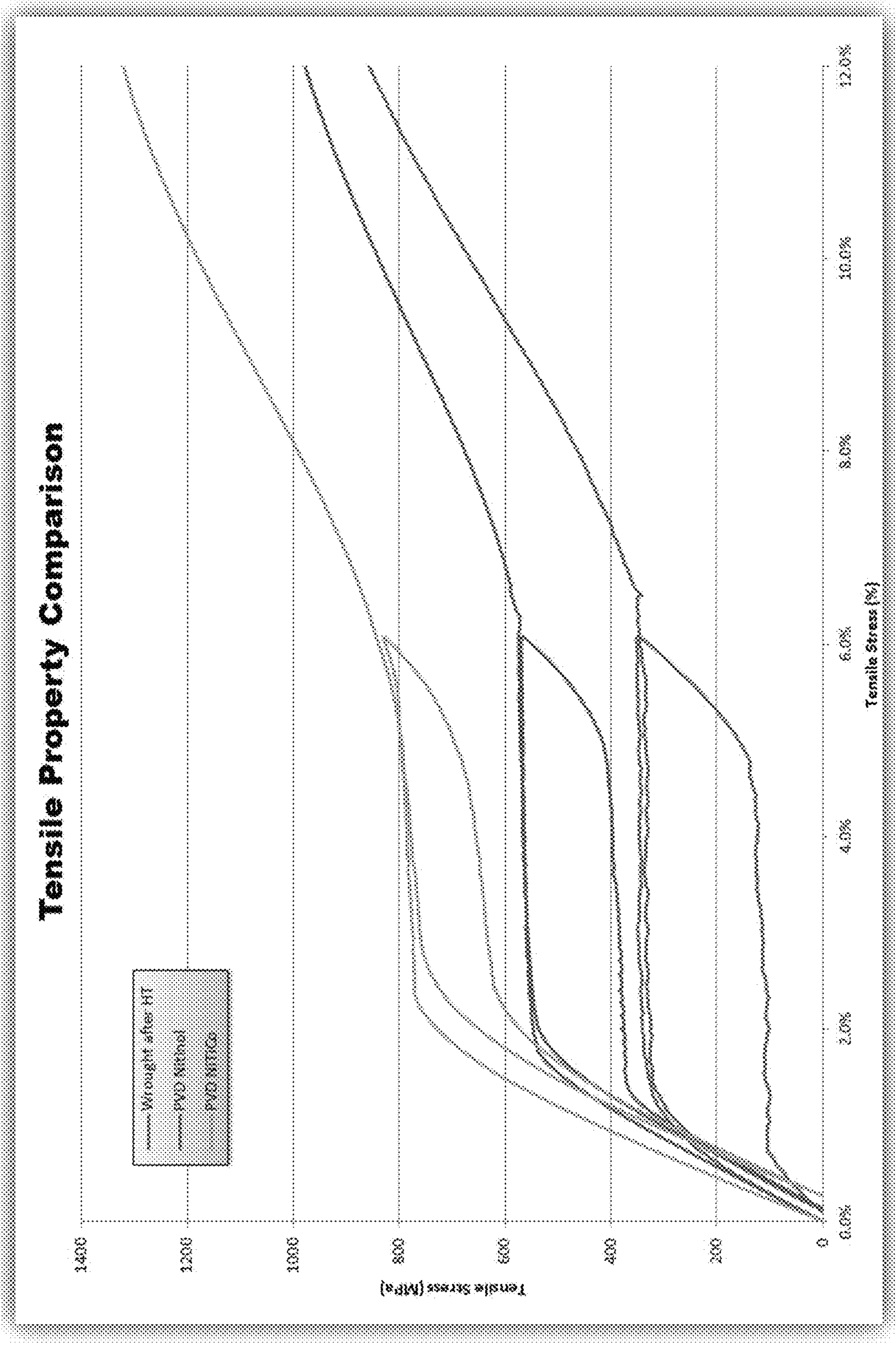
Tensile Property Comparison
Wrought after HT
PVD Nitinol
PVD NiTiCu
Tensile Stress (MPa)
Tensile Stress (%)
0
200
400
600
800
1000
1200
1400
0.0%
2.0%
4.0%
6.0%
8.0%
10.0%
12.0%

PVD DEPOSITED TERNARY AND QUATERNARY NITI ALLOYS AND METHODS OF MAKING SAME

CROSS-REFERENCE TO RELATED APPLICATIONS

The present application is divisional of co-pending U.S. patent application Ser. No. 17/751,245, filed May 23, 2022, which claims priority to U.S. Provisional Patent Application Ser. No. 63/192,539, filed May 24, 2021.

BACKGROUND OF THE INVENTION

The present disclosure relates generally to ternary and quaternary alloys of nickel-titanium (NiTi) and methods of making the same by physical vapor deposition (PVD) processes. A larger number of NiTi ternary and quaternary alloys are generally known as are processes to make such alloys by melt processing the elemental metals, forming ingots, then processing the ingots into precursor shapes of materials by wrought metal processing such as cold-working, drawing, calendaring, casting or the like. Heretofore, however, it has been unknown to form precursor materials or near finished end products by forming the NiTi ternary and/or quaternary alloys during PVD processing and depositing the NiTi ternary and/or quaternary alloys onto a removable substrate to form a bulk material have defined material, physical, electrical, chemical properties and/or grain morphologies, all with minimal inclusion frequency and inclusion size.

Shape memory or superelastic NiTi alloys have been known for a considerable period of time and have garnered widespread use in a variety of applications, including, for example, medical devices, electronics, micro-electromechanical systems, and mechanical devices and systems. NiTi alloys may be binary, ternary or quaternary alloys and each alloy will exhibit different physical, mechanical, electrical, and chemical properties depending upon a number of factors, including, for example, the elements present in the alloy, the stoichiometry of the elements in the alloy, the physical state of the material, e.g., crystalline, polycrystalline, or amorphous, the grain morphology and grain density, and/or the nature, number and/or size of inclusions in the material.

Conventionally, precursor materials fabricated from NiTi ternary and quaternary alloys are made by melting elemental metals into ingots and then working the ingot into the precursor material form, such as a hypotube, as disclosed by U.S. Pat. No. 8,974,517 which discloses forming an ingot by melting nickel with titanium and tungsten, then cooling to form an ingot, hot rolling the alloy ingot and then cold-forming the alloy into a cylinder and drilling the cylinder to form tubing, then cold drawing the tubing and annealing the tubing. Similarly, U.S. Pat. No. 9,339,401 discloses providing an ingot fabricated form NiTi with a ternary alloying element of either tantalum, hafnium, vanadium, zirconium or combinations thereof, with the ternary element present at about 4 atomic percent (at %) to about 30 at %, with the alloy being a two-phase alloy having a first NiTi-rich phase and a second phase rich in the ternary element. The ingot is then processed by cold working the material which forms dendrites and a eutectic mixture that elongates in the working direction.

By using PVD processing, ternary and quaternary NiTi alloy, bulk materials may be made in in the as-deposited state such that the configuration and conformation of a desired precursor material, e.g., wires, tubes, planar materials, curvilinear, or as the near finished end product, e.g., hypotube for stent manufacture, semilunar for cardiac valves or conical for embolic or caval filters, is formed on a removable deposition substrate in the configuration and conformation of the precursor material or near-finished end product. In this manner, either precursor materials or near-finished end product, only post-processing steps such as passivation, electropolishing, laser machining features in the material, and assembly, if required, are needed.

SUMMARY OF THE INVENTION

It is an object of the present disclosure to provide a ternary or a quaternary NiTi alloy deposited in a precursor or a near-finished end-product configuration or conformation.

It is a further object of the present disclosure to provide a PVD deposited ternary or quaternary NiTi shape memory or superelastic alloy formed into a precursor or near-finished end-product configuration and conformation within a vacuum deposition chamber.

It is another object of the present disclosure to provide a method of PVD deposition in which a NiTi ternary or quaternary alloy is deposited from one or more targets onto a removable substrate having the configuration and conformation of a desired precursor and/or near-finished product.

It is still another object of the present disclosure to provide a method of PVD deposition employing plural PVD targets made of elemental metals selected from the group consisting of nickel, titanium, hafnium, tantalum, tungsten, rhenium, iridium, platinum, gold, silver, cobalt, vanadium, iron, chromium, bismuth, or palladium.

It is still another object of the present disclosure to provide a method of PVD deposition employing at least one PVD target made of alloys of metals selected from the group consisting of nickel, titanium, hafnium, tantalum, tungsten, rhenium, iridium, platinum, gold, silver, cobalt, vanadium, iron, chromium, bismuth, or palladium.

It is still a further object of the present disclosure to provide a method of PVD deposition employing at least one PVD target made of elemental metals and alloys of metals selected from the group consisting of nickel, titanium, hafnium, tantalum, tungsten, rhenium, iridium, platinum, gold, silver, cobalt, vanadium, iron, chromium, bismuth, or palladium.

It is yet still another object of the present disclosure that the deposited ternary or quaternary material be characterized by having inclusions present at less than or equal to 1% of the total area of the deposited material.

It is yet a further object of the present disclosure that the deposited ternary or quaternary material be characterized by having inclusions present having

BRIEF DESCRIPTION OF THE DRAWINGS

FIG. 1 is a is a graph depicting the tensile property comparison between wrought nitinol material after heat treatment in curve A, the inventive multi-layer PVD deposited nitinol engineered material in curve B, and the inventive multi-layer PVD deposited PVD deposited nickel-titanium-cobalt alloy in curve C.

DETAILED DESCRIPTION OF THE PREFERRED EMBODIMENTS

For purposes of clarity, the following terms used in this patent application will have the following meanings:

The terminology used herein is for the purpose of describing example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the order discussed or illustrated, unless specifically identified as an order of performance. It is also to be understood that additional or alternative steps may be employed.

When an element or layer is referred to as being "on," "engaged," "connected," or "coupled" to or with another element, it may be directly on, engaged, connected or coupled to the other element or layer, or intervening elements or layers may be present. In contrast, when an element is referred to as being "directly on," "directly engaged to," "directly connected to," or "directly coupled to" or with another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below", or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

"Substantially" is intended to mean a quantity, property, or value that is present to a great or significant extent and less than, more than or equal to total. For example, "substantially vertical" may be less than, greater than, or equal to completely vertical.

"About" is intended to mean a quantity, property, or value that is present at ±10%. Throughout this disclosure, the numerical values represent approximate measures or limits to ranges to encompass minor deviations from the given values and embodiments having about the value mentioned as well as those having exactly the value mentioned. Other than in the working examples provided at the end of the detailed description, all numerical values of parameters (e.g., of quantities or conditions) in this specification, including the appended claims, are to be understood as being modified in all instances by the term "about" whether or not "about" actually appears before the numerical value. "About" indicates that the stated numerical value allows some slight imprecision (with some approach to exactness in the value; approximately or reasonably close to the value; nearly). If the imprecision provided by "about" is not otherwise understood in the art with this ordinary meaning, then "about" as used herein indicates at least variations that may arise from ordinary methods of measuring and using such parameters. In addition, disclosure of ranges includes disclosure of all values and further divided ranges within the entire range, including endpoints given for the ranges.

Recitation of ranges of values herein are merely intended to serve as a shorthand method of referring individually to each separate value falling within the recited range, unless otherwise indicated herein, and each separate value is incorporated into the specification as if it were individually recited herein.

References to "embodiment" or "variant", e.g., "one embodiment," "an embodiment," "example embodiment," "various embodiments," etc., may indicate that the embodiment(s) or variant(s) of the invention so described may include a particular feature, structure, or characteristic, but not every embodiment necessarily includes the particular feature, structure, or characteristic. Further, repeated use of the phrase "in one embodiment," or "in an exemplary embodiment," do not necessarily refer to the same embodiment or variant, although they may.

As used herein the term "method" refers to manners, means, techniques and procedures for accomplishing a given task including, but not limited to, those manners, means, techniques and procedures either known to, or readily developed from known manners, means, techniques and procedures by practitioners of the chemical, pharmacological, biological, biochemical and medical arts. Unless otherwise expressly stated, it is in no way intended that any method or aspect set forth herein be construed as requiring that its steps be performed in a specific order. Accordingly, where a method claim does not specifically state in the claims or descriptions that the steps are to be limited to a specific order, it is in no way intended that an order be inferred, in any respect. This holds for any possible non-express basis for interpretation, including matters of logic with respect to arrangement of steps or operational flow, plain meaning derived from grammatical organization or punctuation, or the number or type of aspects described in the specification.

The term "material" is intended to refer to elemental metals, alloyed metals or pseudometals.

For purposes of this application, the terms "pseudometal" and "pseudometallic" are intended to mean materials which exhibit material characteristics substantially the same as metals. Examples of pseudometallic materials include, without limitation, composite materials, polymers, and ceramics. Composite materials are composed of a matrix material reinforced with any of a variety of fibers made from ceramics, metals, carbon, or polymers.

As used in this application the term "layer" is intended to mean a substantially uniform material limited by interfaces between it and adjacent other layers, substrate, or environment. The interface region between adjacent layers is an inhomogeneous region in which extensive thermodynamic parameters may change. Different layers are not necessarily characterized by different values of the extensive thermodynamic parameters but at the interface, there is a local change at least in some parameters. For example, the interface between two steel layers that are identical in composition and microstructure may be characterized by a high local concentration of grain boundaries due to an interruption of the film growth process. Thus, the interface between layers is not necessarily different in chemical composition if it is different in structure.

The term "build axis" or "build direction" is intended to refer to the deposition axis in the material. For example, as a material is being deposited onto a substrate, the thickness or Z-axis of the material being deposited will increase, this is the build axis of the material.

The terms "circumferential" or "circumferential axis" is intended to refer to the radial direction of a tubular, cylindrical or annular material or to the Y-axis of a polygonal material.

The terms "longitudinal," "longitudinal axis," or "tube axis" are intended to refer to an elongate aspect or axis of a material or to the X-axis of the material.

The term "bulk material" is intended to refer to the entirety of the material between its surfaces.

The term "film" is intended to encompass both thick and thin films and includes material layers, coatings and/or discrete materials regardless of the geometric configuration of the material.

The term "thick film" is intended to mean a film or a layer of a film having a thickness greater than 10 micrometers.

The term "thin film" is intended to mean a film or a layer of a film having a thickness less than or equal to 10 micrometers. The terms "physical vapor deposition" and/or is acronym "PVD" is intended to encompass sputtering, electron-beam deposition, hot-boat evaporation, reactive evaporation, ion platting, plasma sputtering and/or ion beam sputtering.

The following examples are provided in order to illustrate the alternative embodiments of the invention, and are not intended to limit the scope of the invention. In each of the following examples, the described general PVD equipment and process steps and parameters were employed. PVD was performed using a hollow cathode magnetron with the target material lining the inside of the process chamber. Interior to the targets was a carousel loaded with substrates. In the case of tubing, this is a planetary carousel. A suitable PVD reactor with a planetary carousel is described in U.S. Pat. No. 9,640,359 which is hereby incorporated by reference in its entirety. Substrates were typically constructed of polished metal with a diffusion barrier layer on it outer (deposition) surface. Substrates used were tubular, wire, profiled, and three-dimensional. After pumping down to a high vacuum pressure, e.g., <1E-6 Torr, an inert gas was introduced into the chamber at a controlled rate and the chamber pressure was controlled to a fixed level. Magnetic field and electrical potential was applied sufficient to ignite the plasma and generate process temperatures into a range that results in Zone 2 (columnar and most typical) or Zone 3 process temperatures in the Thornton diagram. The charged atoms (ions) from the plasma bombarded the target surface and ejected atoms of target material into the vacuum chamber. Using a DC electric field, the sputtered atoms from the targets were transported to the substrates where they organized into a crystalline structure. Electromagnets on the exterior of the chamber were used to shape the plasma profile to control the uniformity of deposition onto the substrates inside the chamber. Layers were created by interrupting the deposition process enough to initiate a new layer of deposited material or a "plane" of grains Plasma or pseudo-plasma etching, synonymously faux etching, was used at the start of a new layer to increase interlayer bond strength. This bond can also be intentionally weakened, if desired. PVD process parameters were driven by a table of values that were input to a PLC program which executed the process and recorded its outputs. Material properties, total deposition thickness, layer profile, property gradients, and final temper were all controlled by the PLC program and its input parameters. The material produced in this fashion was crystalline with final properties in the as-deposited configuration.

The disclosed PVD method of forming ternary or quaternary NiTi materials is capable of forming coherent single layer bulk materials or bulk materials made of multiple layers in which Individual layers or groupings of layers may be deposited to have different mechanical, electrical, chemical or physical properties by controlling the process parameters for each layer during the deposition.

It will be understood by those skilled the PVD arts, that deposition of films with different chemistries can also be achieved by manipulation of the sputter yields, in-situ doping, or by sequential depositions in different process chambers (or a multi-chamber system). Further material property manipulation can also be achieved post-deposition, if desired, by employing traditional heat treatment and/or working processes.

Example 1: Sputter Deposition of NiTiCo Tubular Material

A cylindrical substrate was introduced into a deposition chamber with capabilities of glow discharge substrate cleaning and sputter deposition of nickel-titanium (NiTi) alloy. The deposition chamber was evacuated to a pressure less than or equal to $1\times10^{-6}$ Torr. The substrate temperature was controlled to achieve a temperature between about 300 and 1100 degrees Centigrade. A bias voltage between −1000 and +1000 volts, preferably between −200 and +10 volts, was applied to the substrate. Power was applied to the cathode to form a plasma within the deposition chamber. Power wattage may be varied to control the applied power and will vary depending upon the plasma conductance, inert gas flow, magnetron power settings, chamber cooling, and deposition chamber configuration, in such a manner to achieve a process temperature to deposit crystalline material. During deposition, the deposition pressure was maintained between 0.1 and 10 mTorr. A sacrificial or barrier layer of substantially uniform thickness may, optionally, be deposited circumferentially on the substrate, alternatively the substrate, itself, may be sacrificial. A NiTi alloy target with cobalt wires welded to it was employed. NiTiCo alloy was deposited from the NiTiCo target onto the cylindrical substrate at a deposition rate between about 5 to 8 microns/hour until a 10 micron layer of NiTiCo was deposited onto the cylindrical substrate.

Example 2: Sputter Deposition of NiTiTa Semilunar Material

The same process parameters are employed as in Example 1, except that a Ni target, a titanium target, and a tantalum target are employed in the cylindrical magnetron, and a plurality of semilunar removable substrates are employed. NiTiTa is deposited onto the semilunar substrates at a deposition rate between about 5 to 8 microns/hour until a 12-micron layer of NiTiTa was deposited onto the semilunar substrates.

FIG. 1 is a tensile property comparison between wrought NiTi, binary NiTi, and ternary NiTiCo showing that ternary NiTiCo has a far higher tensile stress plateau of about 750 MPa to about 800 MPa when compared to both binary NiTi and wrought NiTi and recovery energy of about 800 MPa.

The NiTiCo ternary alloy of the Example 1 was created in two compositions as per Table 1 below:

TABLE 1

| Nickel (wt %) | Cobalt (wt %) | Titanium |
|---|---|---|
| 55.28 | 1.3 | balance |
| 55.54 | 0.65 | balance |

Binary shape memory or superelastic NiTi typically has a Nickel:Titanium ratio of about 1.262, whereas the Nickel: Titanium ratio in the ternary NiTiCo alloy of Example 1 was about 1.273.

Finally, inter- and intragranular inclusions are controlled such that both the size and frequency of the inclusions are minimized and are generally far smaller and evenly disbursed as a result of the PVD processing of the material. PVD deposited binary and ternary nickel-titanium alloys exhibited a mean inclusion size being less than about 45 nanometers and an area fraction of the inclusions relative to the material area is less than or equal to about 0.01% according to one embodiment of the invention. In accordance with another embodiment of the invention, the mean inclusion size is about 35 nanometers with an area fraction of the inclusions relative to the material area is less than about 0.15%. Thus, the mean inclusion size in the inventive material is between about 35 nanometers to about 45 nanometers with an average area fraction of the inclusions being between about 0.01% to about 0.15% of the total material area. Maximum inclusion size was less than about 100 nanometers.

While the invention has been described with reference to its preferred embodiments, those of ordinary skill in the relevant arts will understand and appreciate that the present invention is not limited to the recited preferred embodiments, but that various modifications in material selection, deposition methodology, manner of controlling the grain formation within the bulk material, individual layers, across multiple layers, or throughout the entire thickness of the deposited material, and deposition process parameters may be employed without departing from the invention, which is to be limited only by the claims appended hereto.

What is claimed is:

1. A bulk material comprising a NiTiX ternary or quaternary shape memory or superelastic alloy, wherein X is selected from the group consisting of nickel, titanium, hafnium, tantalum, tungsten, rhenium, iridium, platinum, gold, silver, cobalt, vanadium, iron, chromium, bismuth, or palladium, wherein the bulk material has a mean inclusion size between about 35 nanometers to about 45 nanometers, wherein the bulk material further comprises a plurality of layers within the bulk material.

2. The bulk material of claim 1, wherein further comprising an average area fraction of the inclusions between about 0.01% to about 0.15% of the total material area.

3. The bulk material of claim 1, further comprising a maximum inclusion size less than about 100 nanometers.

4. The bulk material of claim 1, wherein each of the plurality of layers are made of the same ternary or quaternary alloy.

5. The bulk material of claim 1, wherein at least one of the plurality of layers are made of a different ternary or quaternary alloy.

6. The bulk material of claim 1, wherein the bulk material has a non-planar three-dimensional configuration and/or conformation.

7. The bulk material of claim 1, wherein X is cobalt.

8. The bulk material of claim 2, wherein X is cobalt.

9. The bulk material of claim 3, wherein X is cobalt.

10. The bulk material of claim 4, wherein each of the plurality of layers comprise NiTiCo.

11. The bulk material of claim 7, wherein the Nickel: Titanium ratio is between about 1.267 and about 1.273.

12. The bulk material of claim 8, wherein the Nickel: Titanium ratio is between about 1.267 and about 1.273.

13. The bulk material of claim 9, wherein the Nickel: Titanium ratio is between about 1.267 and about 1.273.

14. The bulk material of claim 6, wherein X is cobalt and the non-planar three-dimensional configuration and/or conformation is tubular.

15. The bulk material of claim 6, wherein X is tantalum and the non-planar three-dimensional configuration and/or conformation is semi-lunar.

16. The bulk material of claim 1, wherein X is cobalt and the bulk material exhibits a tensile stress plateau of between about 750 MPa to about 800 MPa.

17. The bulk material of claim 1, wherein X is cobalt and the bulk material exhibits a recovery energy of about 800 MPa.

18. The bulk material of claim 16, wherein the bulk material exhibits a recovery energy of about 800 MPa.

19. The bulk material of claim 1, wherein at least one of the plurality of layers within the bulk material is crystalline.

20. A bulk material comprising a NiTiX ternary or quaternary shape memory or superelastic alloy, wherein X is selected from the group consisting of nickel, titanium, hafnium, tantalum, tungsten, rhenium, iridium, platinum, gold, silver, cobalt, vanadium, iron, chromium, bismuth, or palladium, wherein the bulk material has a mean inclusion size between about 35 nanometers to about 45 nanometers, wherein the nickel:titanium ratio is between about 1.267 and about 1.273.

21. The bulk material of claim 20, wherein further comprising an average area fraction of the inclusions between about 0.01% to about 0.15% of the total material area.

22. The bulk material of claim 20, further comprising a maximum inclusion size less than about 100 nanometers.

23. The bulk material of claim 20, wherein the bulk material comprises a plurality of layers within the bulk material.

24. The bulk material of claim 20, wherein X is cobalt.

25. The bulk material of claim 21, wherein X is cobalt.

26. The bulk material of claim 22, wherein X is cobalt.

27. The bulk material of claim 20, wherein X is cobalt and the bulk material exhibits a tensile stress plateau of between about 750 MPa to about 800 MPa.

28. The bulk material of claim 20, wherein X is cobalt and the bulk material exhibits a recovery energy of about 800 MPa.

29. The bulk material of claim 20, wherein the bulk material is crystalline.

* * * * *